(12) United States Patent
Wang et al.

(10) Patent No.: US 12,148,777 B2
(45) Date of Patent: Nov. 19, 2024

(54) IMAGE SENSOR WITH SPECTRAL-FILTER-BASED CROSSTALK SUPPRESSION

(71) Applicant: OmniVision Technologies, Inc., Santa Clara, CA (US)

(72) Inventors: Qin Wang, San Jose, CA (US); Chin Poh Pang, Pleasanton, CA (US)

(73) Assignee: OmniVision Technologies, Inc.

( * ) Notice: Subject to any disclaimer, the term of this patent is extended or adjusted under 35 U.S.C. 154(b) by 288 days.

(21) Appl. No.: 17/322,399

(22) Filed: May 17, 2021

(65) Prior Publication Data

US 2022/0367548 A1    Nov. 17, 2022

(51) Int. Cl.
    *H01L 27/146*      (2006.01)
    *G02B 5/00*      (2006.01)
    *G02B 5/20*      (2006.01)

(52) U.S. Cl.
CPC ........ *H01L 27/14623* (2013.01); *G02B 5/003* (2013.01); *G02B 5/201* (2013.01); *H01L 27/14621* (2013.01); *H01L 27/14627* (2013.01); *H01L 27/14645* (2013.01)

(58) Field of Classification Search
CPC ......... H01L 27/14623; H01L 27/14621; H01L 27/14627; H01L 27/14645; G02B 5/003; G02B 5/201
See application file for complete search history.

(56) References Cited

U.S. PATENT DOCUMENTS

| | | | |
|---|---|---|---|
| 9,905,605 B2 | 2/2018 | Hsu et al. | |
| 2014/0146206 A1* | 5/2014 | Nakata | H04N 25/76 |
| | | | 29/428 |
| 2014/0159184 A1* | 6/2014 | Lim | H01L 27/14621 |
| | | | 438/70 |
| 2016/0276394 A1* | 9/2016 | Chou | H01L 27/14636 |
| 2016/0307941 A1* | 10/2016 | Cheng | H01L 27/14623 |
| 2017/0110501 A1* | 4/2017 | Hsu | H01L 27/14645 |
| 2017/0125459 A1* | 5/2017 | Tsai | H01L 27/1463 |
| 2017/0201726 A1* | 7/2017 | Yorikado | H01L 27/14605 |
| 2018/0180836 A1* | 6/2018 | Huang | G02B 7/04 |
| 2019/0035838 A1* | 1/2019 | Byun | H01L 27/14605 |

* cited by examiner

*Primary Examiner* — Thao X Le
*Assistant Examiner* — Sean Ayers Winters
(74) *Attorney, Agent, or Firm* — COZEN O'CONNOR (57) ABSTRACT

A crosstalk-suppressing image sensor includes a semiconductor substrate, an opaque layer, and a spectral filter. The semiconductor substrate includes a photodiode therein and is located beneath a light-exposure region of a back surface of the semiconductor substrate. The opaque layer is on the back surface, partially covers the light-exposure region, and has an opaque-layer thickness perpendicular to an image-plane direction parallel to the back surface. The spectral filter is adjacent to the opaque layer in the image-plane direction, and partially covers the light-exposure region.

19 Claims, 6 Drawing Sheets

PDAF sensor element 402

IMAGE SENSOR WITH SPECTRAL-FILTER-BASED CROSSTALK SUPPRESSION

BACKGROUND

Many digital cameras have autofocusing capability. Autofocus may be fully automatic such that the camera identifies objects in the scene and focuses on the identified objects. In some cases, the camera may decide which objects are more important than other objects and subsequently focus on the more important objects. Alternatively, autofocus may utilize user input specifying which portion or portions of the scene are of interest. Based thereupon, the autofocus function identifies objects within the portion(s) of the scene, specified by the user, and focuses the camera on such objects.

One type of autofocusing method is contrast autofocus, wherein the camera adjusts the imaging objective to maximize contrast in at least a region of the scene, thus bringing that region of the scene into focus. More recently, phase-detection autofocus (PDAF) has gained popularity because it is faster than contrast autofocus. Phase-detection autofocus directly measures the degree of misfocus by comparing light passing through one portion of the imaging objective, e.g., the left portion, with light passing through another portion of the imaging objective, e.g., the right portion. Some digital single-lens reflex cameras include a dedicated phase-detection sensor in addition to the image sensor that captures images.

However, this solution is not feasible for more compact and/or less expensive cameras. Therefore, camera manufacturers are developing image sensors with on-chip phase detection. Such image sensors, "PDAF image sensors" herein, have integrated phase detection capability via the inclusion of so-called PDAF pixels in the image sensor's pixel array. The response of such PDAF pixels depends in part on the direction of illumination incident on the pixel after transmission through the imaging objective.

SUMMARY OF THE EMBODIMENTS

One type of PDAF image sensor includes a plurality of partially-shielded pixels. A shield covering part of a light-receiving surface of a pixel restricts the angles of illumination from a scene that can reach a photodiode of the pixel. The resulting partially-shielded pixel is configured, based on the shield position, to detect illumination propagating from just one of four regions of a scene: left, right, top, or bottom. A disadvantage of such PDAF image sensors is optical crosstalk resulting from light reflecting off of the shield of a PDAF pixel and being detected by an adjacent pixel. Embodiments disclosed herein remedy this deficiency.

In a first aspect, a crosstalk-suppressing image sensor is disclosed. The crosstalk-suppressing image sensor includes a semiconductor substrate, an opaque layer, and a spectral filter. The semiconductor substrate includes a photodiode therein and is located beneath a light-exposure region of a back surface of the semiconductor substrate. The opaque layer is on the back surface, partially covers the light-exposure region, and has an opaque-layer thickness perpendicular to an image-plane direction parallel to the back surface. The spectral filter is adjacent to the opaque layer in the image-plane direction, and partially covers the light-exposure region.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
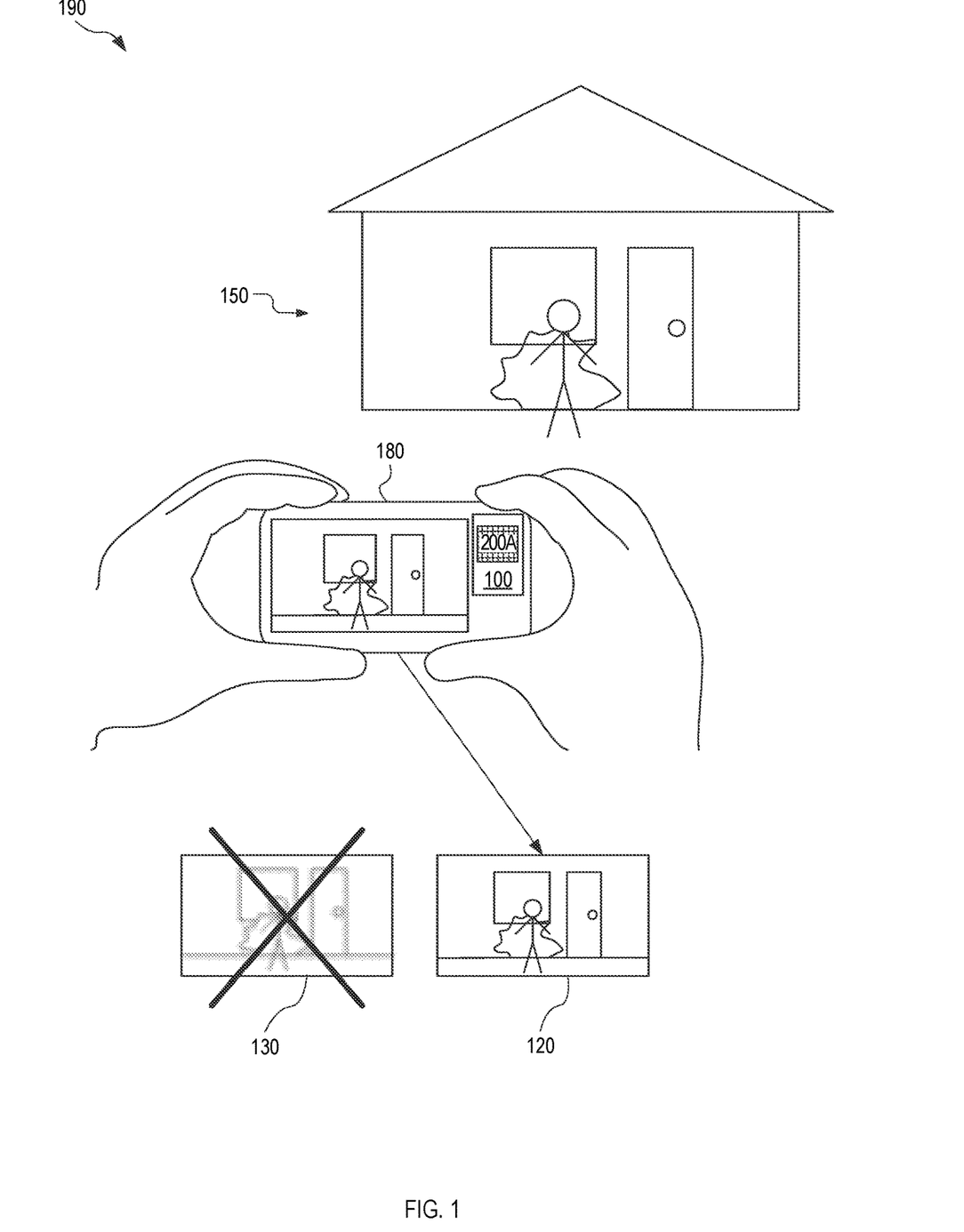
FIG. 1 illustrates an image sensor and a pixel array thereof in an exemplary use scenario.

FIG. 1 illustrates an image sensor 100 with PDAF pixels in an exemplary use scenario 190. Image sensor 100 is implemented in a camera 180 for imaging a scene 150. Camera 180 may be a standalone camera, or may be a camera module integrated into a device, such as a mobile device, a computer, a security device, or a motor vehicle. Camera 180 utilizes on-chip phase detection capability of image sensor 100 to focus on scene 150. When focused, camera 180 utilizes image sensor 100 to capture a focused image 120, instead of a defocused image 130, of scene 150.

Figure 2:
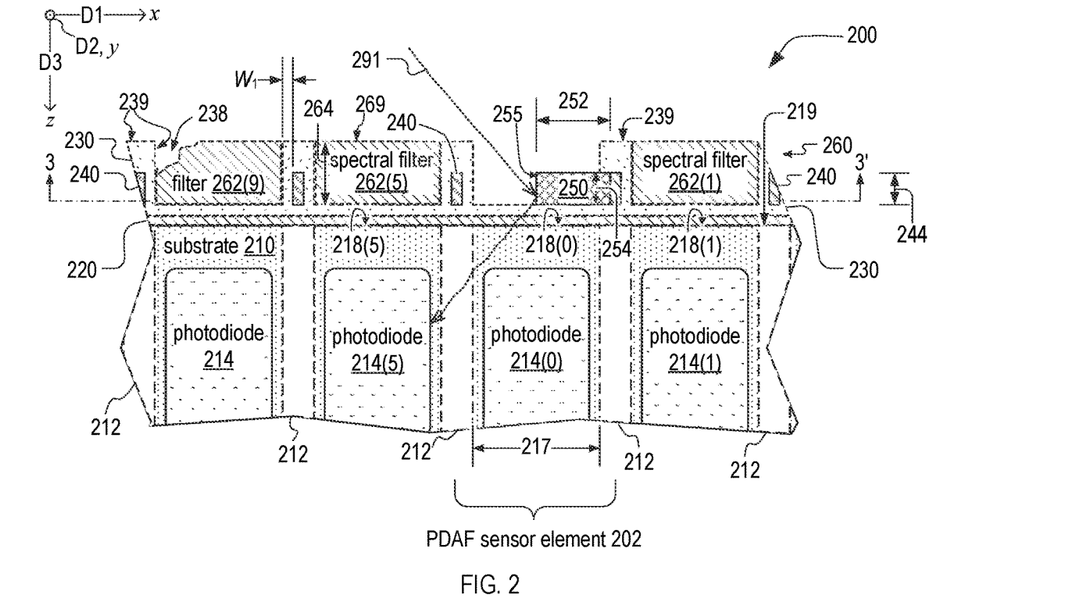
FIGS. 2 and 3 are respective cross-sectional schematics of a first crosstalk-suppressing image sensor, which is an example of the image sensor of FIG. 1.
Figure 3:
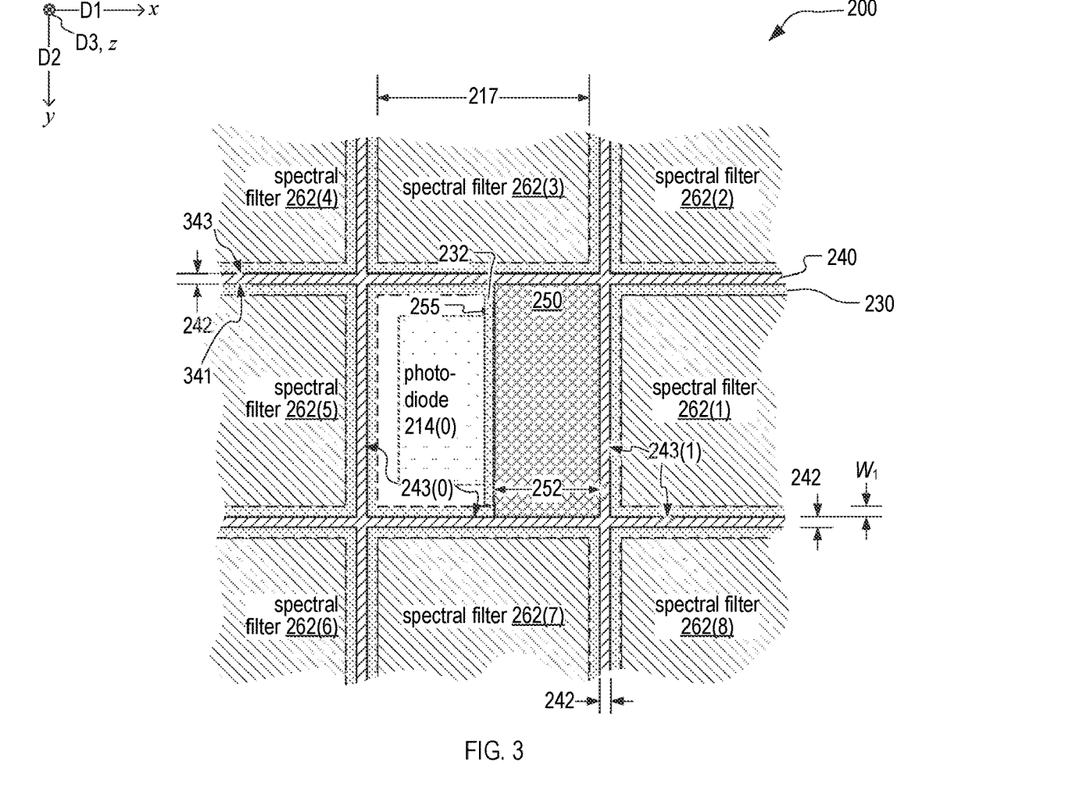

FIGS. 2 and 3 are respective cross-sectional schematics of a crosstalk-suppressing image sensor 200, hereinafter image sensor 200. Image sensor 200 is an example of image sensor 100. The cross-section illustrated in FIG. 2 is parallel to a plane, hereinafter the x-z plane, formed by orthogonal directions D1 and D3, each of which is orthogonal to a direction D2. The schematic of FIG. 3 is in a cross-sectional plane 3-3', which is parallel to the x-y plane and shown in FIG. 2. Herein, the x-y plane is formed by orthogonal directions D1 and D2, and planes parallel to the x-y plane are referred to as transverse planes. Each of directions D1 and D2 qualify as "image-plane directions," as they are parallel to an image plane of camera 180. Unless otherwise specified, heights of objects herein refer to the object's extent along direction D3. Herein, a reference to a direction x, y, or z refers to directions D1, D2, and D3 respectively. Also herein, a horizontal plane is parallel to the x-y plane, length and width refer to an object's extent along the x or y direction, and a vertical direction is along the z direction. Also herein, the phrase "along a direction" D means either in direction D or in the direction 180 degrees opposite direction D, where D is for example D1, D2, or D3.

Image sensor 200 includes a semiconductor substrate 210 and an opaque layer 250. Semiconductor substrate 210 includes an array of photodiodes 214 therein. Opaque layer 250 is above photodiode 214(0), which is one of photodiodes 214. Semiconductor substrate 210 has a back surface 219, which is in a horizontal plane.

In embodiments, image sensor 200 includes a spectral filter array 260, which includes a plurality of spectral filters 262. Each spectral filter 262 is aligned above a respective photodiode 214. In embodiments, spectral filters 262 includes red, blue, and green color filters arranged based on Bayer pattern. In embodiments, spectral filters 262 includes red, blue, and green and infrared color filters arranged based on Bayer pattern. In embodiments, semiconductor substrate 210 includes a plurality of deep-trench isolation structures 212 for reducing electrical crosstalk. Each deep-trench isolation structure 212 is located between a respective pair of adjacent photodiodes 214. In embodiments, each spectral filter 262 includes dye and/or pigment that absorbs certain electromagnetic wavelengths, thereby permitting transmission of light within a certain range of wavelengths complementary to the absorbed wavelengths.

In embodiments, image sensor 200 includes an opaque grid 240, which forms a plurality of interconnected opaque annular grid-cells each aligned over a respective one of photodiode 214. The shape of the aperture of each annular grid-cell may be polygonal (e.g., square, rectangular, hexagonal), circular, elliptical, or a combination thereof. FIGS. 2 and 3 denote widths 242 of annular grid segments of annular grid cells in directions D1 and D2. Width 242 is, for example, a distance between an inner surface 341 and an outer surface 343 of opaque grid 240, as shown in FIG. 3. In embodiments, width 242 is between 0.04 micrometers and 0.20 micrometers. In embodiments, a titanium nitride film, not shown in FIG. 2, is between segments of opaque grid 240 and dielectric layer 230.

FIG. 3 denotes an interior surface 243(1) of opaque grid 240. Interior surface 243(1) is aligned above photodiode 214(1) and forms a rectangular aperture of opaque grid 240. In embodiments, opaque grid 240 is formed of a metal. Candidate metals include, but are not limited to, aluminum, tungsten, and an alloy including at least one of aluminum and tungsten.

Herein, each part of back surface 219 located directly above a photodiode region 214 grid is denoted as a respective light-exposure region 218. Each photodiode 214 is beneath a respective light-exposure region 218 of back surface 219. Each spectral filter 262 is directly above a respective light-exposure region 218. Hence, at least part of each light-exposure region 218 is between a respective spectral filter 262 and a respective photodiode 214. For example, at least part of light exposure region 218(1) is between spectral filter 262(1) and photodiode 214(1) along direction D3.

In embodiments, image sensor 200 also includes a dielectric layer 220 between spectral filter array 260 and top surface 219 of semiconductor substrate 210. Dielectric layer 220 may be formed of an oxide material and may function as a buffer layer for relieving stress and preventing processing damage to semiconductor substrate 210.

In embodiments, image sensor 200 also includes a dielectric layer 230 on top surface 219. When image sensor 200 includes dielectric layer 220, dielectric layer 230 may completely cover dielectric layer 220. Dielectric layer 230 is between adjacent spectral filters 262 in horizontal planes and, in the vertical direction, is between each spectral filter 262 and top surface 219. In such embodiments, opaque grid 240 is embedded in dielectric layer 230. Dielectric layer 230 has a non-planar top surface 239 that forms a plurality of recesses 238 in dielectric layer 230. Part of spectral filter 262(9) is removed to illustrate one recess 238. Each recess 238 has a width 217, which in embodiments is also a width of light-exposure region 218(0), such that a peripheral region of light-exposure region 218(0) is not directly above photodiode 214 located directly therebeneath. In embodiments, dielectric layer 230 has a refractive index smaller than that of spectral filter 262. In embodiments, dielectric layer 230 is formed of oxide material such as silicon oxide.

Image sensor 200 includes a PDAF sensor element 202, which includes a photodiode 214, denoted as photodiode 214(0). While cross-sectional plane 3-3' does not intersect semiconductor substrate 210, FIG. 3 depicts photodiode 214(0) for illustrative purposes. Opaque grid 240 includes an interior surface 243(0) that forms an aperture aligned to photodiode 214(0) and define light-exposure region 218(0) above photodiode 214(0). PDAF sensor element 202 includes an opaque layer 250 located on back surface 219 such that it partially covers light-exposure region 218(0). Opaque layer 250 blocks a portion of light propagating toward light-exposure region 218(0) from reaching photodiode 214(0). With opaque layer 250 partially covering light-exposure region 218(0), only incident light to be detected by photodiode 214(0) is that which is incident on part of light-exposure region 218(0) that is not covered by opaque layer 250. Opaque layer 250 has a width 252 and a thickness 254 along directions D1 and D3 respectively. Width 252 exceeds width 242 of grid segments that form opaque grid 240.

In embodiments, opaque layer 250 is monolithically formed with opaque grid 240. In such embodiments, interior surface 243(0) includes a side surface 255 of opaque layer 250, such that opaque grid 240 includes an occluded annular grid-cell formed by surface 243(0) and side surface 255. In embodiments, opaque layer 250 is a metal layer, where the metal may be aluminum, tungsten, or an alloy including at least one of aluminum and tungsten. In embodiments, a titanium nitride film, not shown in FIG. 2, is between grid segments of opaque layer 250 and dielectric layer 230, and between grid segments of opaque grid 240 and dielectric layer 230 to enhance material bonding strength or adhesiveness therebetween.

Opaque grid 240 has a thickness 244, which in embodiments is between 0.05 micrometers and 0.25 micrometers. In embodiments, at least one of width 242 and thickness 244 exceeds a penetration depth $\delta=\lambda_O/(\pi\kappa)$ of light into the grid, where $\lambda_O$ is a free-space electromagnetic wavelength between 0.40 micrometers and 0.75 micrometers and $\kappa$ is the imaginary part of the refractive index (at $\lambda_O$) of the material that forms opaque grid 240.

FIG. 2 depicts an oblique optical ray 291 (e.g., red light) incident on PDAF sensor element 202. Specifically, oblique optical ray 291 is incident on side surface 255 of opaque layer 250, which reflects oblique optical ray 291 toward an adjacent photodiode 214(5) that is aligned beneath spectral filter 262(5). This reflection results in optical crosstalk. While a deep-trench isolation structure 212 between adjacent photodiodes 214 may reduce such crosstalk, it does not eliminate the crosstalk.

Figure 4:
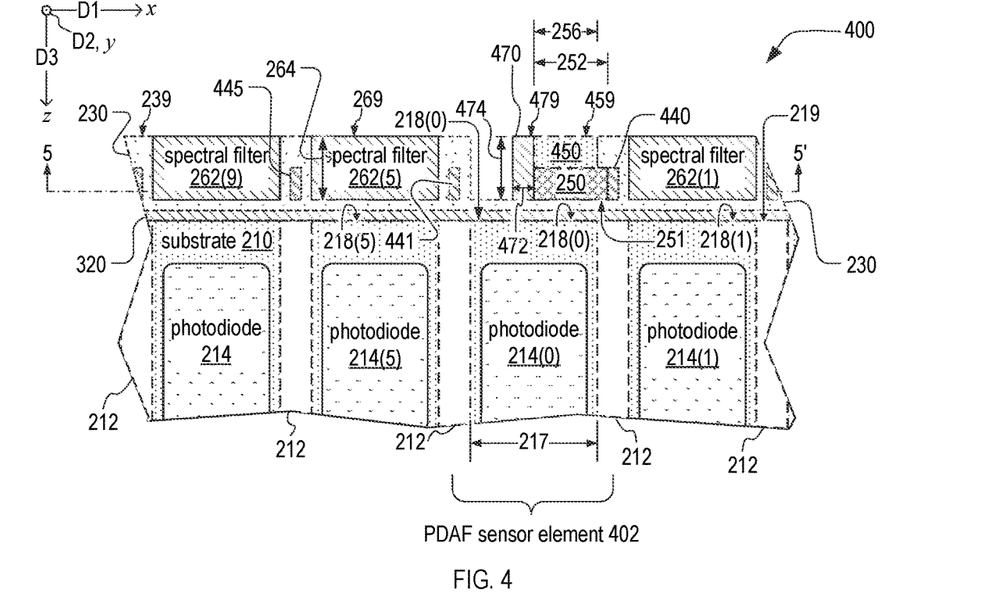
FIGS. 4 and 5 are respective cross-sectional schematics of a second crosstalk-suppressing image sensor, which is an example of the image sensor of FIG. 2.
Figure 5:
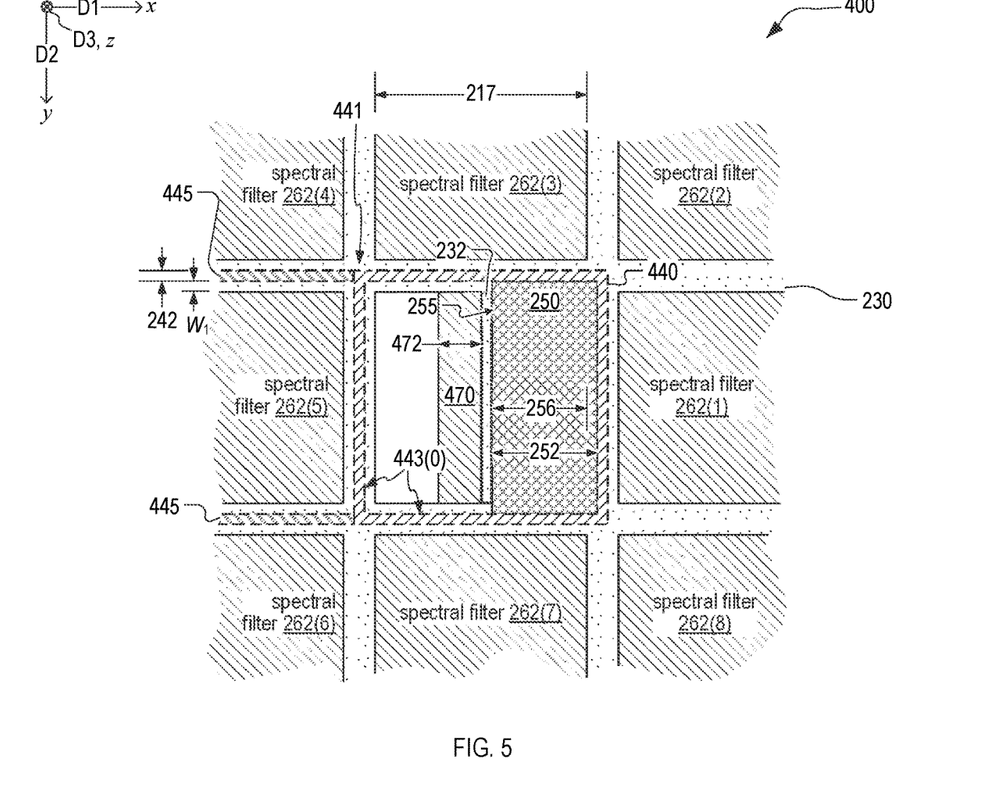

FIGS. 4 and 5 are respective cross-sectional schematics of a crosstalk-suppressing image sensor 400, hereinafter image sensor 400. The schematic of FIG. 5 is in an example horizontal cross-sectional plane 5-5' shown in FIG. 4.

Image sensor 400 is an example of image sensor 200 that includes a spectral filter 470. Image sensor 400 includes at least one PDAF sensor element 402, which is an example of PDAF sensor element 202 with the addition of spectral filter 470. In embodiments, image sensor 400 includes a plurality of PDAF sensor elements 402 interspersed throughout, which enables camera 180 to adjust its focus based on signals from PDAF sensor elements in selected regions of image sensor 400, and hence on selected regions of scene 150 imaged thereon.

Spectral filter 470 is adjacent to opaque layer 250 along direction D1 and partially covers light-exposure region 218(0). In embodiments, spectral filter 470 adjoins opaque layer 250. Spectral filter 470 absorbs oblique optical ray 291 and hence prevents crosstalk caused by reflection of oblique optical ray 291 by side surface 255.

Spectral filter 470 has a width 472 and a thickness 474 along directions D1 and D3 respectively. In embodiments, thickness 474 equals or exceeds thickness 254 of opaque layer 250, which enables spectral filter 470 to absorb light propagating toward side surface 255. When thickness 474 equals thickness 254, an oblique optical ray propagating toward an upper section of side surface 255 need only propagate through a top surface 479 of spectral filter 470, and hence propagate distance through spectral filter 470 that is less than width 472. In such instances, spectral filter 470 may not adequately attenuate the optical ray such that the partially attenuated light causes optical crosstalk after reflecting from side surface 255. Hence, an additional benefit of thickness 474 exceeding thickness 254 is to guarantee that spectral filter 470 sufficiently attenuates said oblique optical ray.

Opaque layer 250 has a width 252, of which a width 256 covers light-exposure region 218(0) along direction D1. When image sensor 400 includes dielectric layer 230, width 252 may exceed width 256 by a thickness of dielectric layer 230, along direction D1, that covers opaque layer 250. In embodiments width 256 equals width 252.

In embodiments, width 472 of spectral filter 470 along direction D1 is less than width 252 such that a sufficient area of light-exposure region 218(0) is unexposed, and hence able to detect light such that PDAF sensor element 202 can provide data for the PDAF capability of image sensor 400. In embodiments, a combined width of opaque layer 250 and spectral filter 470 over light-exposure region 218(0), that is, width 256 plus width 472, is between one-half and three-quarters of width 217 of light-exposure region 218(0) along direction D1. In embodiments, when a width of light-exposure region 218(0) equals 1.0 micrometers, width 256 of opaque layer 250 is between 0.35 micrometers and 0.45 micrometers, and width 472 of spectral filter 470 is between 0.15 micrometers and 0.25 micrometers.

Since oblique optical ray 291 propagates through spectral filter layer 470 twice, width 472 of spectral filter layer 470 may be less than a thickness 264 of a spectral filter 262 that has the same transmission spectrum. In embodiments, width 472 of spectral filter 470 is between one-third and one-half of thickness 264 of spectral filter 262. In embodiments, thickness 264 is between 0.1 micrometers and 1.0 micrometers.

In embodiments, image sensor 400 includes a dielectric layer 450 on a top surface of opaque layer 250. Dielectric layer 450 facilitates formation of a microlens above recess 238, formed by dielectric layer 230, located above photodiode 214(0). Dielectric layer 450 has a top surface 459. Opaque layer 250 has a bottom surface 251. Thickness 474 of spectral filter 470 is greater than or equal to a distance between bottom surface 251 and top surface 459 of dielectric layer 450. In embodiments, thickness 474 equals thickness 264 of spectral filters 262, which facilitates fabrication of color filter array 260. In embodiments, top surface 459 is coplanar with at least one of (i) inter-trench regions of top surface 239 of dielectric layer 230 and (ii) top surfaces 269 of spectral filters 262. In embodiments, inter-trench regions of top surface 239 are coplanar with top surfaces 269.

In embodiments, dielectric layer 230 covers each of grid segments and opaque layer 250 of opaque grid 240. In embodiments, dielectric layer 230 includes a thin layer 232 between opaque layer 250 and spectral filter 470, as illustrated in FIG. 3. In such embodiments, dielectric layer 230 provides protection to grid segments of opaque grid 240 by preventing processing damages to grid segments and opaque layer 250 during spectral filter formation process. In embodiments, dielectric layer 230 coats a thin layer on the sides of grid segments of opaque grid 240. When dielectric layer 230 includes thin layer 232, a combined width of opaque layer 250, thin layer 232 and spectral filter 470 over light-exposure region 218(0), is between one-half and three-quarters of width 217 of light-exposure region 218(0) along direction D1.

In embodiments, a width $W_1$ of a coating portion of dielectric layer 230 in direction D1 is less than width 242 of grid segments in at least one of directions D1 and D2, for example at least 30% less. In one example, width 242 is between 100 nanometers and 250 nanometers and width $W_1$ is between 30 nanometers and 75 nanometers.

In embodiments, spectral filter 470 is disposed directly adjacent to opaque layer 250, i.e., no material such as thin layer 232 of dielectric layer 230 is formed between, for example as illustrated by the schematic of FIG. 4. While embodiments of image sensor 400 include thin layer 232, FIG. 4 does not illustrate thin layer 232 for clarity of illustration.

Each of spectral filter 470 and spectral filters 262 have respective spectral passbands. In embodiments, the passbands of at least one of spectral filters 262(1) and 262(2), which are above photodiodes 214 adjacent to photodiode 214(0), differ from the passband of spectral filter 470. In embodiments, each spectral filter 262 is one of a red, blue, and a green spectral filter such that spectral filters 262 may form a Bayer pattern on semiconductor substrate 210. In embodiments, spectral filter 470 is one of a neutral-density filter and a blue spectral filter and each of spectral filters 262(1-8) is one of a green spectral filter and a red spectral filter. A blue spectral filter has a passband that spans a region of the visible electromagnetic spectrum, for example, free-space wavelengths between 0.45 micrometers and 0.49 micrometers. In embodiments, spectral filter 470 includes dye and/or pigment that absorbs certain wavelengths of light, such as blue light, more efficiently than other wavelengths, such as red and green light, thereby permitting transmission of light within a certain range of wavelengths complementary to the absorbed wavelengths. In embodiments, spectral filter 470 has an attenuation coefficient, as used in the Beer-Lambert law, that is larger at free-space wavelengths between 0.45 micrometers and 0.49 micrometers than at other visible wavelengths, e.g., between 0.49 micrometers and 0.75 micrometers.

A benefit of spectral filter 470 being (in embodiments) a blue spectral filter is that it efficiently attenuates light of longer visible wavelength, such as red light and green light, each of which propagates further into silicon than does blue light, and hence contributes to more crosstalk. In embodiments, spectral filter 470 is able to filter or absorb incident stray light (e.g., oblique optical ray 291) twice—once as the stray light propagates through spectral filter 470 toward opaque layer 250, and once after opaque layer 250 reflects the stray light reflects off of propagates through spectral filter,—thereby reducing optical crosstalk. Additionally, in embodiments, spectral filters 262 include a plurality of blue spectral filters, such that spectral filter 470 may be formed of a same filter material of these blue spectral filters 262 and be fabricated in the same lithography process as these blue spectral filters 262, which simplifies fabrication and reduces fabrication cost.

In embodiments, image sensor 400 includes an occluded annular grid-cell 440 that includes opaque layer 250. Annular grid-cell 440 is located on back surface 219, is aligned above photodiode 214(0), and defines light-exposure region 218(0) to photodiode 214(0). Part of opaque layer 250 protrudes into an aperture of the occluded annular grid-cell. FIG. 5 denotes an interior surface 443(0) of annular grid-cell 440 that, with side surface 255 of opaque layer 250, forms an aperture of annular grid-cell 440. In embodiments, opaque layer 250 is monolithically formed with annular grid-cell 440.

In embodiments, image sensor 400 also includes an adjacent opaque annular grid-cell 445 on back surface 219 and aligned above photodiode 214(5). Annular grid cell 445 has width 242 in each of directions D1 and D2. Annular grid cells 440 and 445 share a common grid segment 441 that extends along direction D2. In embodiments, annular grid-cells 440 are formed of one of aluminum, tungsten, and any combination thereof. In embodiments, image sensor 400 includes opaque grid 240 such that each of annular grid-cells 440 and 445 are respective grid cells of opaque grid 240.

Figure 6:
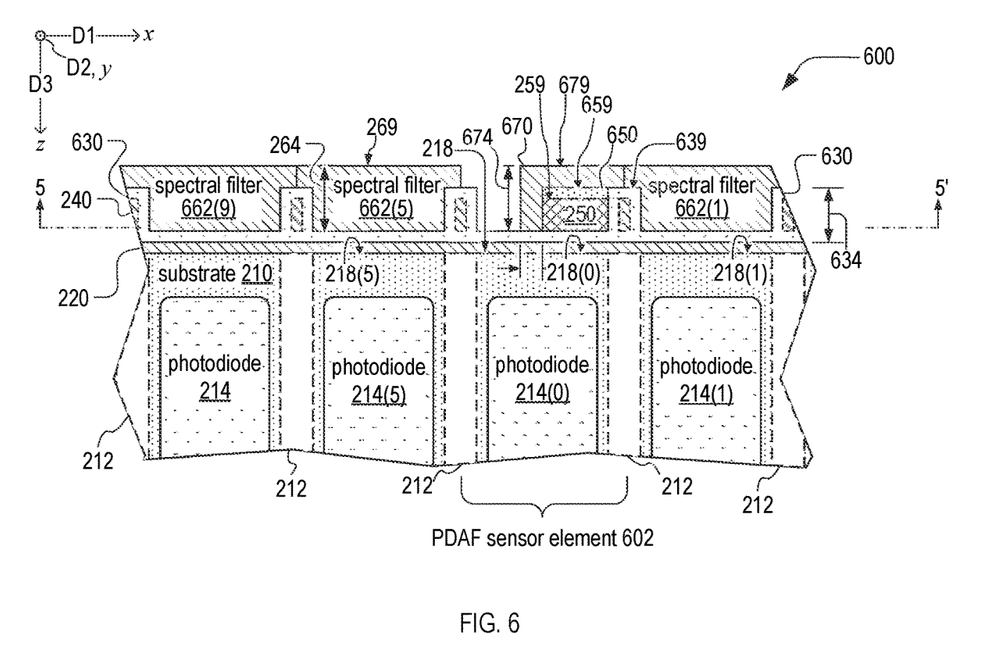
FIG. 6 is a cross-sectional schematic of a third crosstalk-suppressing image sensor, which is an embodiment of the image sensor of FIGS. 4 and 5.

FIG. 6 is an example cross-sectional schematic of a crosstalk-suppressing image sensor 600, hereinafter image sensor 600. The cross-sectional view of FIG. 5 also represents image sensor 600 in cross-sectional plane 5-5' shown in FIG. 6. Image sensor 600 is an example of image sensor 400 that includes spectral filters 662 and a dielectric layer 630. Dielectric layer 630 has a thickness 634 and is an example of dielectric layer 230. Each spectral filter 662 is an example of a spectral filter 262, and has a thickness 264.

A primary difference between image sensor 600 and image sensor 400 is that its dielectric layer (dielectric layer 630) is thinner than its spectral filters 662 along direction D3. That is, thickness 634 of dielectric layer 630 is less than thickness 264 of spectral filters 662. Accordingly, image sensor 600 also includes a spectral filter 670 that, like spectral filter 470 of image sensor 400, covers side surface 255 of opaque layer 250, while also covering a top surface of opaque layer 250. Image sensor 600 includes a dielectric layer 650 on a top surface of opaque layer 250. Dielectric layer 650 is an example of dielectric layer 450, has a top surface 659, and may be part of dielectric layer 630. Inter-trench regions of top surface 659 may be coplanar with a top surface 639 of dielectric layer 630. Spectral filter 670 covers top surface 659.

In embodiments, a width of dielectric layer 630 coated on sides of grid segment of opaque grid 240 in at least one of directions D1 and in D2 is less than width of each grid segment of opaque grid 240 in respective directions D1 and D2.

Spectral filter 670 has a thickness 674 and a top surface 679. In embodiments, thickness 674 equals thickness 264 of spectral filters 262 such that top surface 679 is coplanar with top surfaces 269 of spectral filters 262. This coplanarity facilitates fabrication of additional layers thereon, such as a microlens array, discussed below. In embodiments, spectral filter 670 covers opaque layer 250 such that incident light directed to respective photodiode 214 is attenuated by spectral filter 670 before reaching a top surface 259 of opaque layer 250. Such attenuation reduces crosstalk caused by light that reflects off of top surface 259.

FIG. 6 denotes a PDAF sensor element 602, which is an example of PDAF sensor element 402. In embodiments, image sensor 600 includes a plurality of PDAF sensor elements 602 interspersed throughout, which enables camera 180 to adjust its focus based on signals from PDAF sensor elements in selected regions of image sensor 600, and hence on selected regions of scene 150 imaged thereon.

Figure 7:
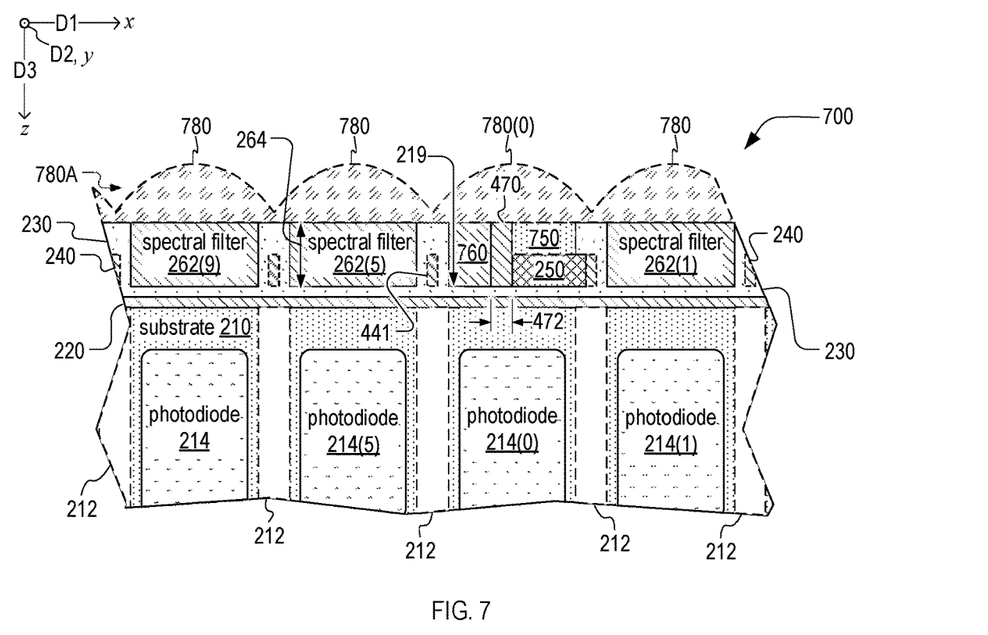
FIG. 7 is a cross-sectional schematic of a fourth crosstalk-suppressing image sensor, which is an embodiment of the image sensor of FIG. 4.

FIG. 7 is a cross-sectional schematic of a crosstalk-suppressing image sensor 700, hereinafter image sensor 700, which is image sensor 400 with the addition of a transparent layer 760 on light exposure region 218(0). Spectral filter 470 is located between transparent layer 760 and opaque layer 250 along direction D1. When image sensor 700 includes grid segment 441, transparent layer 760 is located between spectral filter 470 and grid segment 441 along direction D1. Image sensor 700 also includes a dielectric layer 750, which is an example of dielectric layer 450 in which the combined thicknesses of opaque layer 250 and dielectric layer 750 equals thickness 264 of spectral filters 262.

In embodiments, image sensor 700 includes a microlens 780(0) on transparent layer 760 and above each of opaque layer 250 and spectral filter 470. Microlens 780(0) is aligned to direct light incident thereon to photodiode 214(0). In embodiments, transparent layer 760 and microlens 780(0) are formed of the same material, and may also be monolithically formed. In embodiments, transparent layer 760 and microlens 780 are formed of material, such as a polymer, having refractive index smaller than that of spectral filter 470. In embodiments, image sensor 700 includes additional microlenses 780, each aligned above a respective photodiode 214 that forms a microlens array 780A. In embodiments, and when image sensor 700 includes a plurality of spectral filters 262 and a plurality of PDAF sensor elements 402, each microlens 780 is aligned above either a spectral filter 262 or a spectral filter 470. In embodiments, microlens array 780A has a coating thereon, such as an oxide coating, which may function as an antireflective coating.

Figure 8:
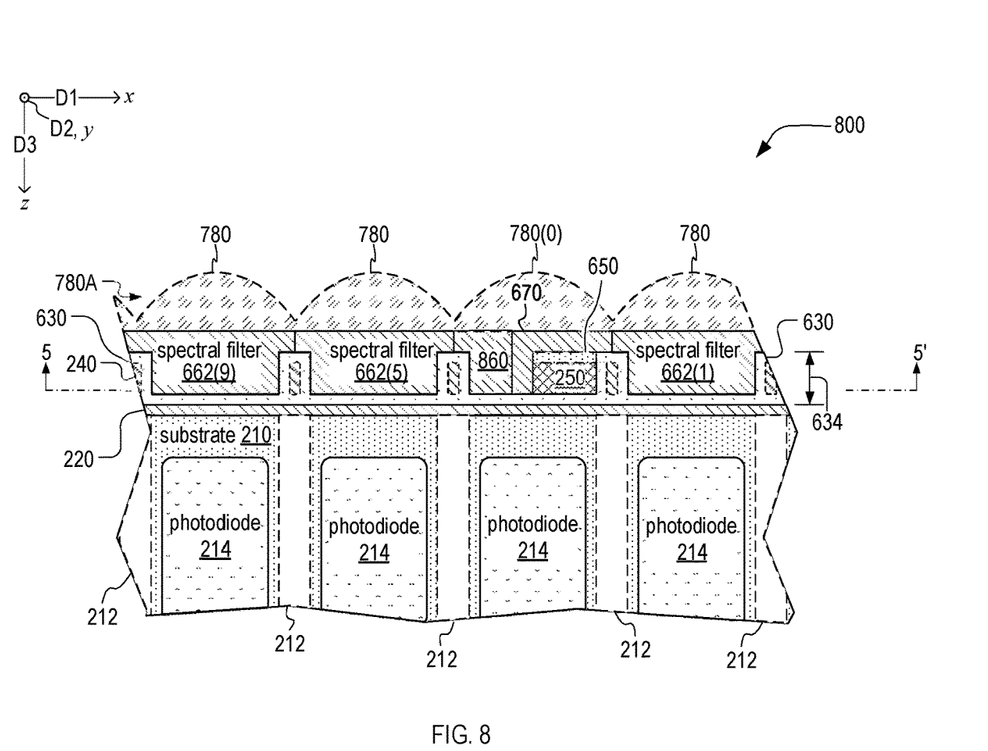
FIG. 8 is a cross-sectional schematic of a fifth crosstalk-suppressing image sensor, which is an embodiment of the image sensor of FIG. 6.

FIG. 8 is a cross-sectional schematic of a crosstalk-suppressing image sensor 800, hereinafter image sensor 800, which is image sensor 600 with the addition of a transparent layer 860 on light exposure region 218(0). Part of spectral filter 670 is located between transparent layer 860 and opaque layer 250 along direction D1. Transparent layer 860 is an example of transparent layer 760. When image sensor 800 includes grid segment 441, part of transparent layer 860 is located between spectral filter 670 and grid segment 441 along direction D1.

In embodiments, image sensor 800 includes microlens 780(0) on transparent layer 860 and above each of opaque layer 250 and spectral filter 470. Microlens 780(0) is aligned to direct light incident thereon to photodiode 214(0). In embodiments, image sensor 800 includes microlens array 780A. Each microlens 780 is aligned above either a spectral filter 662 or a spectral filter 670 that is aligned above a respective photodiode 214. In embodiments, transparent layer 860 and microlens 780(0) are formed of the same material, and may also be monolithically formed.

Figure 9:
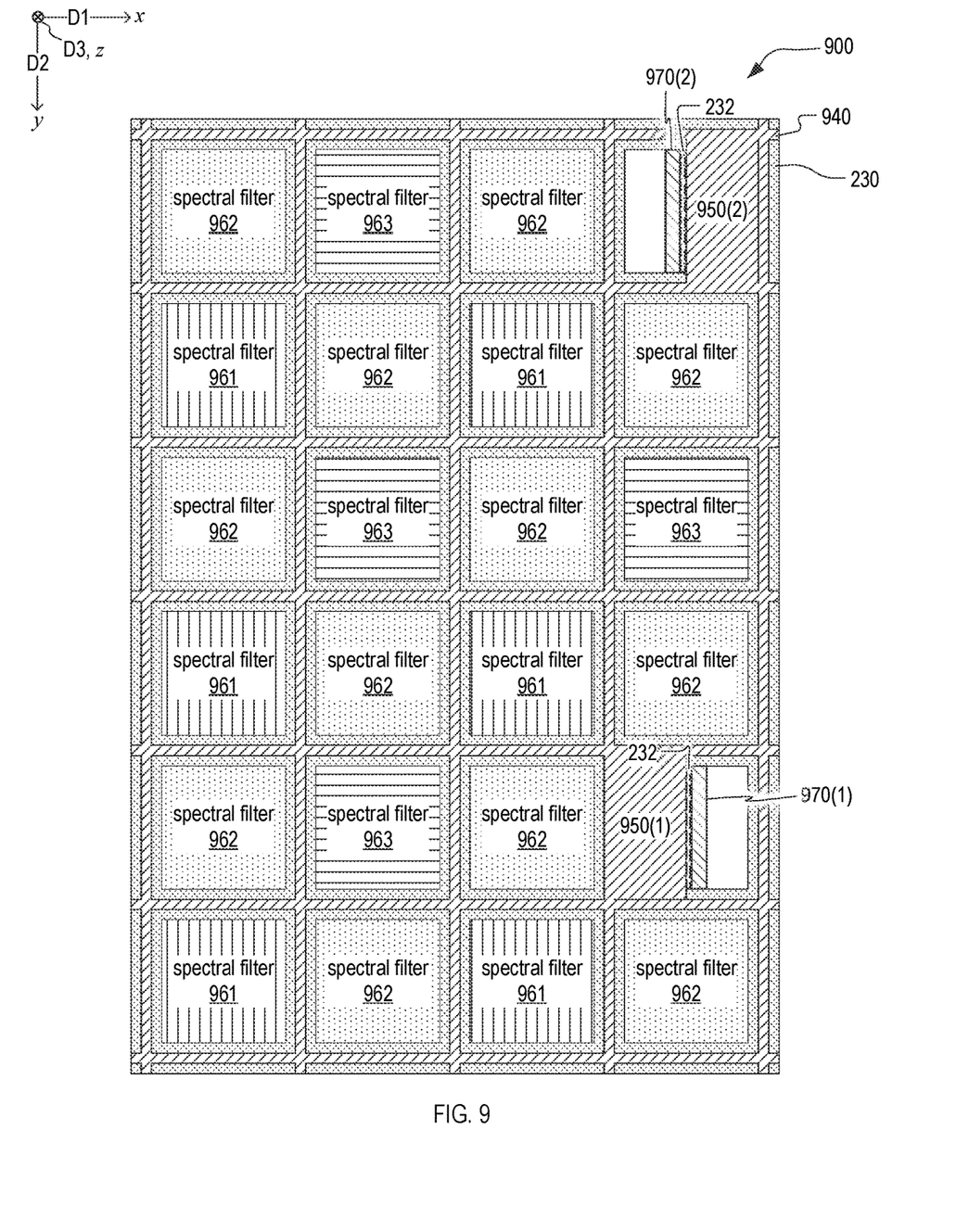
FIG. 9 is a plan view of a rectangular section of an embodiment of the cross-talk suppressing image sensor of FIGS. 4 and 5.

FIG. 9 is a cross-sectional schematic of a rectangular section of an image sensor 900, which is an example of cross-talk suppressing image sensor 400 of FIGS. 4 and 5. The schematic of FIG. 9 is in an example horizontal cross-sectional plane 5-5' shown in FIG. 4. Image sensor 900 includes dielectric layer 230, an opaque grid 940, and a plurality of spectral filters 961-963. Each spectral filter 961-963 is an example of a spectral filter 262, and collectively form a spectral filter array. In embodiments, each spectral filter 961, 962, and 963 is a red spectral filter, green spectral filter, and a blue spectral filter respectively, and hence form a Bayer pattern. In embodiments, spectral filter 961, 962, and 963 are arranged for normal image pixels, where photodiodes underlying spectral filter 961, 962, and 963 are configured for image signal detection. In embodiments, spectral filter 950(1) and 950(2) are arranged as PDAF sensing pixels, where photodiodes underlying spectral filter 950(1) and 950(2) are configured to detect left and right portion of light for phase difference detection.

Opaque grid 940 is an example of opaque grid 240, and includes a first opaque layer 950(1) and a second opaque layer 950(2), each of which are examples of opaque layer 250. Image sensor 900 also includes spectral filters 970(1) and 970(2) that are adjacent to opaque layers 950(1) and 950(2) respectively, and are each examples of spectral filter 470. Defining the negative x direction and the positive x direction and left and right, respectively, spectral filter 970(1) is on the right side of opaque layer 950(1) while spectral filter 970(2) is on the left side of opaque layer 950(2). In embodiments, spectral filters 970(1) and 970(2) are examples of spectral filter 670, and hence cover opaque layers 950(1) and 950(2) respectively.

Combinations of Features

Features described above as well as those claimed below may be combined in various ways without departing from the scope hereof. The following enumerated examples illustrate some possible, non-limiting combinations.

(A1) A crosstalk-suppressing image sensor includes a semiconductor substrate, an opaque layer, and a spectral filter. The semiconductor substrate includes a photodiode therein and is located beneath a light-exposure region of a back surface of the semiconductor substrate. The opaque layer is on the back surface, partially covers the light-exposure region, and has an opaque-layer thickness perpendicular to an image-plane direction parallel to the back surface. The spectral filter is adjacent to the opaque layer in the image-plane direction, and partially covers the light-exposure region.

(A2) In embodiments of image sensor (A1), the spectral filter adjoins the opaque layer.

(A3) In embodiments of either one of image sensors (A1) and (A2), the spectral filter has a filter-thickness that equals or exceeds the opaque-layer thickness.

(A4) In embodiments of any one of image sensors (A1)-(A3), a width of the spectral filter is less than a width of the opaque layer in the image-plane direction.

(A5) In embodiments of image sensor (A4), a combined width of the opaque layer and the spectral is being between one-half and three-quarters of a width of the light-exposure region in the image-plane direction.

(A6) Embodiments of any one of image sensors (A1)-(A5) further include a dielectric layer on a top surface of the opaque layer. A filter thickness of the spectral filter is greater than or equal to a distance between a bottom surface of the opaque layer and a top surface of the dielectric layer.

(A7) In embodiments of image sensor (A6), the spectral filter covers the top surface of the dielectric layer.

(A8) Embodiments of any one of image sensors (A1)-(A7) further include an occluded annular grid-cell that includes the opaque layer, located on the back surface and aligned above the photodiode, part of the opaque layer protruding into an aperture of the occluded annular grid-cell.

(A9) In embodiments of image sensor (A8), the semiconductor substrate includes, adjacent to the photodiode, an adjacent photodiode located beneath an adjacent light-exposure region of the back surface that is adjacent to the light-exposure region. Such embodiments also include an adjacent spectral filter covering the adjacent light-exposure region, and having a same thickness equal as the spectral filter.

(A10) In embodiments of image sensor (A9), a pass band of the spectral filter differs from a pass band of the adjacent spectral filter.

(A11) In embodiments of image sensor (A10), the spectral filter is one of a neutral-density filter and a blue spectral filter; the adjacent spectral filter is one of a green spectral filter and a red spectral filter.

(A12) Embodiments of any one of image sensors (A9)-(A11) further include an adjacent opaque annular grid-cell on the back surface, aligned above the adjacent photodiode, and having a width, between an inner surface and an outer surface thereof and in the image-plane direction, that is less than a width of the opaque layer.

(A13) In embodiments of image sensor (A12), the adjacent opaque annular grid-cell and the opaque layer are formed of a same material.

(A14) Embodiments of either one of image sensors (A12) and (A13) further include an array of photodiodes and an opaque grid of interconnected opaque annular grid-cells. The array of photodiodes are in the semiconductor substrate and include the photodiode and the adjacent photodiode. The opaque grid is a grid of interconnected opaque annular grid-cells each aligned over a respective photodiode of the array of photodiodes. The interconnected opaque annular grid-cells include the occluded annular grid-cell and the adjacent opaque annular grid-cell. Such embodiments may also include a dielectric layer covering the opaque grid and the opaque layer. A section of the dielectric layer is located between the spectral filter and the opaque layer.

(A15) Embodiments of any one of image sensors (A1)-(A14) further include a transparent layer on the light-exposure region, the spectral filter being located between the transparent layer and the opaque layer in the image-plane direction.

(A16) Embodiments of image sensor (A15) further include a microlens on the transparent layer and above each of the opaque layer and the spectral filter.

(A17) In embodiments of image sensor (A16), the microlens and the transparent layer are monolithic.

(A18) In embodiments of any one of image sensors (A1)-(A17), the opaque layer being a metal layer.

(A19) In embodiments of any one of image sensors (A1)-(A18), the opaque layer is formed of one of aluminum and tungsten.

(A20) In embodiments of any one of image sensors (A1)-(A19), the spectral filter is one of a neutral-density filter and a blue spectral filter.

(A21) In embodiments of any one of image sensors (A1)-(A20), the spectral filter includes a material, such as a dye or a pigment that absorbs blue light more efficiently than it does green light and red light.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A crosstalk-suppressing image sensor comprising:
   a semiconductor substrate including a photodiode therein and a back surface; n opaque layer on the back surface; and
   a spectral filter adjacent to the opaque layer in an image-plane direction parallel to the back surface;
   at least part of the opaque layer and at least part of the spectral filter being directly above the photodiode;
   the spectral filter adjoining the opaque layer such that the spectral filter is in direct contact with the opaque layer.

2. The image sensor of claim 1, the maximum overall filter-width of the spectral filter in the image-plane direction being less than a width of the opaque layer in the image-plane direction.

3. The image sensor of claim 2, a combined width of the opaque layer and the maximum filter-width of the spectral filter being between one-half and three-quarters of a width of the photodiode in the image-plane direction.

4. The image sensor of claim 1, further comprising a dielectric layer on a top surface of the opaque layer, a filter thickness of the spectral filter being greater than or equal to a distance between a bottom surface of the opaque layer and a top surface of the dielectric layer.

5. The image sensor of claim 1, further comprising:
   an occluded annular grid-cell that includes the opaque layer and is located on the back surface and aligned above the photodiode, part of the opaque layer protruding into an aperture of the occluded annular grid-cell, wherein, in a cross-sectional plane perpendicular to the back surface where the opaque layer does not span the aperture, the maximum overall filter width of the spectral filter in the image-plane direction is less than a width of the opaque layer in the image-plane direction.

6. The image sensor of claim 1, the spectral filter being one of a neutral-density filter and a blue spectral filter.

7. The image sensor of claim 5, the semiconductor substrate including an adjacent photodiode next to the photodiode; and further comprising:
   an adjacent opaque annular grid-cell on the back surface, aligned above the adjacent photodiode, and having a width, between an inner surface and an outer surface thereof and in the image-plane direction, that is less than a width of the opaque layer.

8. The image sensor of claim 7, the adjacent opaque annular grid-cell and the opaque layer being formed of a same material.

9. The image sensor of claim 7, further comprising:
   an array of photodiodes in the semiconductor substrate and including the photodiode and the adjacent photodiode;
   an opaque grid of interconnected opaque annular grid-cells each aligned over a respective photodiode of the array of photodiodes, the interconnected opaque annular grid-cells including the occluded annular grid-cell and the adjacent opaque annular grid-cell; and
   a dielectric layer covering the opaque grid and the opaque layer, and including a section located between the spectral filter and the opaque layer.

10. The image sensor of claim 1, further comprising a transparent layer at least part of which is directly above the photodiode, the spectral filter being located between the transparent layer and the opaque layer in the image-plane direction.

11. The image sensor of claim 10, further comprising a microlens on the transparent layer and above each of the opaque layer and the spectral filter, such that the transparent layer is between the photodiode and the microlens in a direction perpendicular to the back surface.

12. The image sensor of claim 11, the microlens and the transparent layer being monolithic and formed of a same material.

13. The image sensor of claim 1, further comprising an annular grid cell having an aperture aligned directly above the photodiode, the maximum overall filter-width of the spectral filter in the image-plane direction being less than a maximum width of the photodiode in the image-plane direction.

14. A crosstalk-suppressing image sensor comprising:
    a semiconductor substrate including a photodiode therein;
    an opaque layer on a back surface of the semiconductor substrate;
    a spectral filter adjacent to the opaque layer in an image-plane direction parallel to the back surface;
    a transparent layer on the back surface, the spectral filter being located between the transparent layer and the opaque layer in the image-plane direction; and
    a microlens disposed over the transparent layer, the opaque layer, and the spectral filter;
    at least part of each of the opaque layer, the spectral filter, the transparent layer, and the microlens being directly above the photodiode, such that the transparent layer is between the photodiode and the microlens in a direction perpendicular to the back surface,
    the spectral filter adjoining the opaque layer such that the spectral filter is in direct contact with the opaque layer.

15. The image sensor of claim 14, the semiconductor substrate including an adjacent photodiode adjacent to the photodiode in the image-plane direction, and further comprising:
- an adjacent spectral filter, at least part of the adjacent spectral filter being directly above the adjacent photodiode; and
- an adjacent microlens disposed on the spectral filter,
- the maximum overall width of the adjacent spectral filter, proximate the adjacent microlens, exceeding the maximum overall filter width, proximate the microlens, of the spectral filter in the imaging plane direction.

16. The image sensor of claim 15, further comprising an annular grid cell having an aperture aligned directly above the photodiode, the maximum filter-width being less than a maximum width of the photodiode in the image-plane direction.

17. The image sensor of claim 14, further comprising an annular grid cell on the back surface and surrounding the transparent layer.

18. The image sensor of claim 1, the semiconductor substrate including an adjacent photodiode next to the photodiode, the spectral filter having a having a maximum filter-width in the image-plane direction, and further comprising:
- an adjacent spectral filter having a maximum adjacent-filter width in the image-plane direction that exceeds the maximum filter-width, and being coplanar with the spectral filter in a plane parallel to the back surface of the semiconductor substrate, at least part of the adjacent spectral filter being directly above the adjacent photodiode.

19. The image sensor of claim 14, the spectral filter and the transparent filter having a same overall thickness between the microlens and the back surface.

* * * * *